(12) United States Patent
Kawamura

(10) Patent No.: US 10,352,786 B2
(45) Date of Patent: Jul. 16, 2019

(54) PRESSING SENSOR AND ELECTRONIC DEVICE

(71) Applicant: Murata Manufacturing Co., Ltd., Nagaokakyo-shi, Kyoto-fu (JP)

(72) Inventor: Hideki Kawamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/794,165

(22) Filed: Oct. 26, 2017

(65) Prior Publication Data

US 2018/0045586 A1 Feb. 15, 2018

Related U.S. Application Data

(63) Continuation of application No. PCT/JP2016/066108, filed on Jun. 1, 2016.

(30) Foreign Application Priority Data

Jun. 11, 2015 (JP) .................. 2015-118508

(51) Int. Cl.
*G01L 1/16* (2006.01)
*H03M 1/12* (2006.01)
(Continued)

(52) U.S. Cl.
CPC .............. *G01L 1/16* (2013.01); *H01L 41/042* (2013.01); *H01L 41/053* (2013.01);
(Continued)

(58) Field of Classification Search
CPC ... G01L 1/16; G01L 1/225; G01L 9/08; G01L 9/008; G06F 3/0414; H01L 41/1132; H01L 41/053; H03M 1/12
(Continued)

(56) References Cited

U.S. PATENT DOCUMENTS 4,009,447 A * 2/1977 Wolf .................. G01L 1/16
310/314
4,807,482 A * 2/1989 Park .................. G01D 1/06
374/177
(Continued)

FOREIGN PATENT DOCUMENTS

JP H05-253037 A 10/1993
JP H11-148878 A 6/1999
(Continued)

OTHER PUBLICATIONS

International Search Report issued in International Application No. PCT/JP2016/066108, dated Jul. 5, 2016.
(Continued)

*Primary Examiner* — Jonathan M Dunlap
(74) *Attorney, Agent, or Firm* — Arent Fox LLP

(57) ABSTRACT

A pressing sensor that includes a pressing portion deformed by pressing, a piezoelectric sensor that generates a detection voltage based on the deformation amount, and a first current-voltage conversion circuit that converts a charge/discharge current for a capacitance of the piezoelectric sensor into a voltage signal and outputs the voltage signal. Moreover, a deformation amount detector obtains an integrated value of an output voltage and detects the integrated value as the deformation amount of the pressing portion. A minute vibration sensor detects presence or absence of minute vibration of the pressing portion according to presence or absence of a minute fluctuation state of the output voltage and an integration reset processor resets the integrated value in response to absence of the minute vibration.

16 Claims, 14 Drawing Sheets

(51) Int. Cl.
*G06F 3/041* (2006.01)
*H01L 41/04* (2006.01)
*H01L 41/053* (2006.01)
*H01L 41/113* (2006.01)
*H01L 41/193* (2006.01)

(52) U.S. Cl.
CPC ........... *H01L 41/1132* (2013.01); *H03M 1/12* (2013.01); *G06F 3/0414* (2013.01); *H01L 41/193* (2013.01)

(58) Field of Classification Search
USPC ....... 73/777, 862.68; 324/123 C, 123 R, 678
See application file for complete search history.

(56) References Cited

U.S. PATENT DOCUMENTS

| | | | | |
|---|---|---|---|---|
| 5,118,966 A * | 6/1992 | Kumada | ................ | G01R 29/24 327/100 |
| 5,298,602 A * | 3/1994 | Shikinami | ................ | A61F 2/28 252/62.9 R |
| 5,443,780 A * | 8/1995 | Matsumoto | ........... | B29C 55/005 264/176.1 |
| 5,621,178 A * | 4/1997 | Van Pelt | .................... | G01L 1/08 73/862.381 |
| 6,037,703 A * | 3/2000 | Kambe | ..................... | G01L 1/16 29/25.35 |
| 6,218,898 B1 * | 4/2001 | Zanetti | ................... | G01D 3/036 310/311 |
| 6,466,036 B1 * | 10/2002 | Philipp | ..................... | G01D 5/24 324/658 |
| 7,181,977 B2 * | 2/2007 | Thompson | ................ | G01L 1/16 73/777 |
| 7,997,144 B1 * | 8/2011 | Pekarek | .................... | G01L 1/16 73/777 |
| 8,132,468 B2 * | 3/2012 | Radivojevic | .............. | G01L 1/16 73/777 |
| 8,183,751 B2 * | 5/2012 | Tajitsu | .................. | H01L 41/193 310/328 |
| 8,508,217 B2 * | 8/2013 | Eguchi | ................... | G01D 18/00 324/102 |
| 8,648,151 B2 * | 2/2014 | Yoshida | .................. | C08G 63/08 252/62.9 R |
| 8,789,426 B1 * | 7/2014 | Pekarek | .................... | G01L 1/16 73/777 |
| 8,829,121 B2 * | 9/2014 | Yoshida | .................. | H01L 41/45 252/62.9 R |
| 8,946,974 B2 * | 2/2015 | Yu | ........................ | D01D 5/0038 252/62.9 PZ |
| 8,960,022 B2 | 2/2015 | Tanhua et al. | | |
| 9,048,426 B2 * | 6/2015 | Ando | ..................... | H01L 41/193 |
| 9,184,372 B2 * | 11/2015 | Yoshida | .................. | H01L 41/45 |
| 9,772,236 B2 * | 9/2017 | Ando | ......................... | G01L 1/16 |
| 9,778,765 B2 | 10/2017 | Ishii et al. | | |
| 9,910,535 B2 * | 3/2018 | Kitada | ..................... | G06F 3/044 |
| 2006/0199659 A1 * | 9/2006 | Caldwell | ............ | A63B 69/3608 473/221 |
| 2010/0308794 A1 * | 12/2010 | Townsend | ................ | G01B 7/16 324/103 P |
| 2011/0109204 A1 * | 5/2011 | Tajitsu | .................. | H01L 41/193 310/348 |
| 2012/0108783 A1 * | 5/2012 | Ando | ..................... | H01L 41/193 528/272 |
| 2013/0086997 A1 | 4/2013 | Tanhua et al. | | |
| 2013/0108061 A1 * | 5/2013 | Ando | .................... | G06F 3/0433 381/55 |
| 2014/0049137 A1 * | 2/2014 | Ando | ........................ | G01B 7/16 310/330 |
| 2014/0230573 A1 * | 8/2014 | Ando | ....................... | G01B 7/22 73/862.625 |
| 2014/0331791 A1 | 11/2014 | Ishii et al. | | |
| 2015/0199061 A1 | 7/2015 | Kitada et al. | | |
| 2016/0195994 A1 * | 7/2016 | Kitada | .................... | G06F 3/044 345/174 |

FOREIGN PATENT DOCUMENTS

| | | |
|---|---|---|
| JP | 2013-530398 A | 7/2013 |
| WO | WO 2013/111841 A1 | 8/2013 |
| WO | WO 2014/050683 A1 | 4/2014 |

OTHER PUBLICATIONS

Written Opinion of the International Search Authority issued in International Application No. PCT/JP2016/066108, dated Jul. 5, 2016.

* cited by examiner

PRESSING SENSOR AND ELECTRONIC DEVICE

CROSS REFERENCE TO RELATED APPLICATIONS

The present application is a continuation of PCT/JP2016/066108 filed Jun. 1, 2016, which claims priority to Japanese Patent Application No. 2015-118508, filed Jun. 11, 2015, the entire contents of each of which are incorporated herein by reference.

TECHNICAL FIELD

The present disclosure relates to a pressing sensor that detects a pressing force at the time of operation by a finger or the like, and an electronic device including the pressing sensor.

BACKGROUND

Conventionally, various sensors have been devised as sensors used for a touch-type input device capable of detecting a pressing force (push amount) at the time of operation by a finger or the like. For example, Patent Document 1 (identified below) discloses a push amount detecting sensor including a piezoelectric sensor that outputs a push signal corresponding to a displacement amount obtained when an operation surface is pushed. Moreover, a push amount calculating unit is provided that integrates a difference between the push signal and a reference potential, and outputs a push amount detection signal based on an integration result.

Patent Document 2 (identified below) discloses a sensor that detects a pressing state according to the magnitude of a pressing force based on a signal generated by a piezoelectric element.

Patent Document 1: International Publication No. 2014/050683.

Patent Document 2: Japanese Patent Application Laid-Open No. H5-253037.

To use the piezoelectric sensor as a pressing sensor, it is necessary to reproduce a pressing profile by integrating the signal generated by the piezoelectric element. However, an integration error occurs due to a temperature drift of a circuit, an AD conversion error, plastic deformation of an adhesive provided in a sensor, and the like. Thus, as time elapses, an integrated value tends to deviate from an actual pressing force.

In the sensor disclosed in Patent Document 1, since the sensor is configured to detect a state where the operation surface is not touched and to reset the integrated value, the problem of the deviation can be avoided. However, since a contact detection sensor that detects a contact with the operation surface is required, the structure of the sensor is complicated. In addition, when signal processing for detecting the pressing force and signal processing by the contact detection sensor are individually performed, new processing for communicating a state showing whether or not the operation surface is touched by means of the contact detection sensor is required, so that an arithmetic processing load increases.

SUMMARY OF THE INVENTION

In view of the above, a pressing sensor is disclosed that avoids the problem of cumulative error accompanying integration processing without complicating a structure of a sensor. Moreover, an electronic device is disclosed that includes the pressing sensor.

In contrast, as disclosed in Patent Document 2, in the method of detecting the pressing state according to whether or not the magnitude of the pressing force exceeds a predetermined threshold or not based on the detection signal generated by the piezoelectric element, even if contact by a fingertip or the like occurs, the detection signal does not necessarily become more than the threshold. Since the signal generated by the piezoelectric element is a differential component of the pressing force, a pressing state with a constant pressing force or a state where the pressing force changes slowly cannot be detected.

In view of the above, a pressing sensor is disclosed that is also capable of detecting a pressing state with a stable pressing force and a state where the pressing force changes slowly. Moreover, an electronic device that includes the pressing sensor is also disclosed.

Accordingly, a pressing sensor is provided that includes a pressing portion deformed by pressing, a piezoelectric sensor that generates a detection voltage corresponding to a deformation amount of the pressing portion, a first current-voltage conversion circuit that converts a charge/discharge current for a capacitance of the piezoelectric sensor into a voltage signal and outputs the voltage signal, a deformation amount detector that obtains an integrated value of an output voltage of the first current-voltage conversion circuit and detects the integrated value as the deformation amount of the pressing portion, a minute vibration sensor that detects presence or absence of minute vibration of the pressing portion according to presence or absence of a minute fluctuation state of the output voltage of the first current-voltage conversion circuit, and an integration reset processor that resets the integrated value in response to an absence of the minute vibration.

Absence of the minute vibration (i.e., transition from a detection state of the minute vibration to a no-detection state) means that vibration due to human anesthetic muscle movement or the like has disappeared (i.e., the timing at which pressing by human being is canceled). An integrated value of a deformation amount calculator is reset by the integration reset processor at the time of the transition from the detection state of the minute vibration to the non-detection state. This eliminates accumulation of an integration error due to a temperature drift of a circuit, an AD conversion error, plastic deformation of an adhesive provided in a sensor, and the like. Moreover, a problem of cumulative error due to integration processing is avoided without complicating a structure of the sensor.

According to an exemplary aspect, it is preferable that the minute vibration sensor performs detection according to whether or not the deformation amount of the pressing portion calculated by the deformation amount calculator exceeds a predetermined threshold. With this configuration, presence or absence of minute vibration can be detected by merely comparing the magnitude of the deformation amount of the pressing portion and the threshold, so that the minute vibration can be detected with a small calculation load or by a simple signal processing circuit.

According to another exemplary aspect, it is preferable that the deformation amount detector includes an AD converter, which converts the output voltage of the first current-voltage conversion circuit into a digital value, and an arithmetic section that integrates the digital value obtained by conversion by the AD converter. With this configuration, it is possible to cope with a pressing operation for a long time as compared with a configuration in which integration is performed by an integrating circuit, and a detection error of a pressing force due to an error of a circuit constant can be reduced.

According to another exemplary aspect, it is preferable that the pressing sensor further includes a second current-voltage conversion circuit that current-voltage converts a current corresponding to a change rate of the output voltage of the first current-voltage conversion circuit. Moreover, the deformation amount detector preferably includes an AD converter, which converts the output voltage of the first current-voltage conversion circuit into a digital value. Also, an arithmetic section is preferably provided that carries out a second-order integration operation on the digital value obtained by conversion by the AD converter. With this configuration, a detection sensitivity for minute vibration is enhanced by construction of a two-stage amplifier circuit and the action of a second-order differential due to the second current-voltage conversion circuit.

According to another exemplary aspect, it is preferable that the arithmetic section includes a first-order integration reset processor that resets a first-order integrated value when detecting that one of the change amount and change rate of the first-order integrated value is less than a predetermined value. With this configuration, the resetting of the second-order integrated value and the canceling of accumulation of errors of the first-order integrated value can be performed each time. Moreover, accumulation of errors of the second-order integrated value is suppressed.

According to another embodiment, a pressing sensor is disclosed that includes a pressing portion deformed by pressing, a pressure sensor that generates a detection signal corresponding to a deformation amount of the pressing portion, a deformation amount detector that detects the deformation amount from the detection signal of the pressure sensor, and a minute vibration sensor that detects presence or absence of minute vibration of the pressing portion according to presence or absence of a minute fluctuation state of the detection signal of the pressure sensor.

When the minute vibration detector detects a minute vibration state of the pressing portion, this state is a stable pressing state according to a human body, so that processing peculiar to pressing according to the human body can be performed by the above configuration. In addition, since presence or absence of operation by the human body is detected by detection of minute vibration, even in a state where pressing is performed with a stable pressing force in a state where the pressing force is weak or a state where the pressing force changes slowly, presence or absence of the operation by the human body can be detected.

In another embodiment, the electronic device disclosed herein includes the pressing sensor in any one of the above noted aspects and further includes a controller that performs predetermined control according to a detection result of the minute vibration sensor. With this configuration, an electronic device which performs predetermined processing while distinguishing between pressing by a human body and other pressing is configured.

In yet another embodiment, it is preferable that the controller performs predetermined control according to presence or absence of the minute vibration and the detection result of the deformation amount detector. With this configuration, it is possible to provide an electronic device in which predetermined processing is executed according to a state of pushing operation by a fingertip or the like.

According to the pressing sensor of the current embodiments, it is possible to obtain a pressing sensor that avoids the problem of cumulative error due to integration processing without utilizing a special sensor other than the pressing sensor. Moreover, an electronic device is disclosed that includes the pressing sensor. In addition, since presence or absence of operation by the human body is detected by detection of minute vibration, it is possible to obtain a pressing sensor, in which even in a state where pressing is performed with a stable pressing force in a state where the pressing force is weak or a state where the pressing force changes slowly, presence or absence of the operation by the human body can be detected. Moreover, an electronic device is disclosed that includes the pressing sensor.

DETAILED DESCRIPTION

Figure 1:
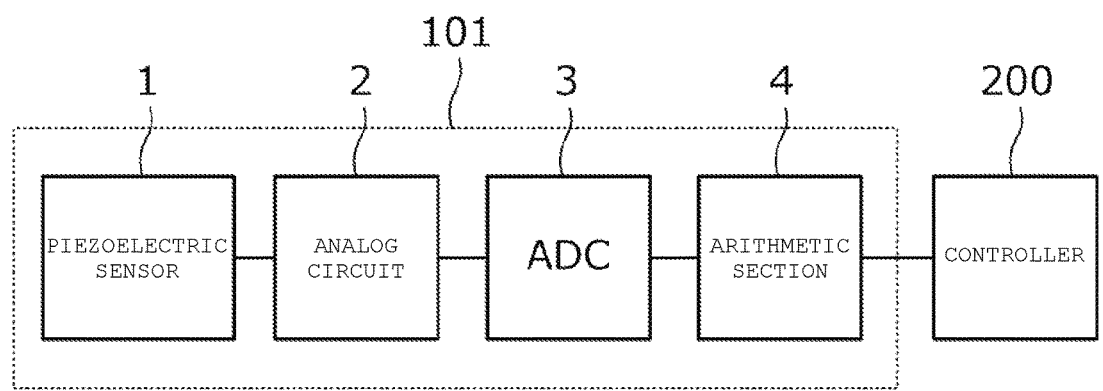
FIG. 1 is a circuit diagram of a pressing sensor 101 according to a first embodiment and a controller 200 which performs predetermined control according to its output.

Hereafter, exemplary embodiments will be described by giving a number of specific examples while referring to the drawings. Like symbols denote like portions in the drawings. Although embodiments are separately shown for the sake of convenience in consideration of explanation of essential features or easiness of understanding, partial substitutions or combinations of configurations shown in different embodiments are possible. In subsequent embodiments, description of matters common to the first embodiment will be omitted, and only the differences will be described. In particular, the same operational effects achieved using the same configurations will not be repeatedly described in the individual exemplary embodiments of the present disclosure.

First Embodiment

In the first embodiment, a pressing sensor with second-order differential and second-order integration is shown.

FIG. 1 is a circuit diagram of a pressing sensor 101 according to the first embodiment and a controller 200 that performs predetermined control according to its output. The pressing sensor 101 includes a piezoelectric sensor 1, an analog circuit 2, an AD converter 3, and an arithmetic section 4. The piezoelectric sensor 1 generates a detection voltage corresponding to a deformation amount of a pressing portion, which can be an operation surface of the corresponding electronic device, for example. The analog circuit 2 outputs a voltage signal by performing signal processing, which will be described later, on the detection voltage generated by the piezoelectric sensor 1. The AD converter 3 converts an output voltage of the analog circuit 2 into a digital value at a predetermined sampling period. The arithmetic section 4 performs calculation, which will be described later, based on the digital value obtained by conversion by the AD converter 3, and thereby detects the deformation amount of the pressing portion and presence or absence of minute vibration of the pressing portion. A controller 200 performs predetermined control to be described later in accordance with detection of the deformation amount of the pressing portion and presence or absence of minute vibration detected by the arithmetic section 4. It is noted that the controller 200 and/or arithmetic section 4 can each be formed by a processor, microprocessor, or similar structure, include memory and software necessary to perform the disclosed algorithms and calculations described herein.

Figure 2:
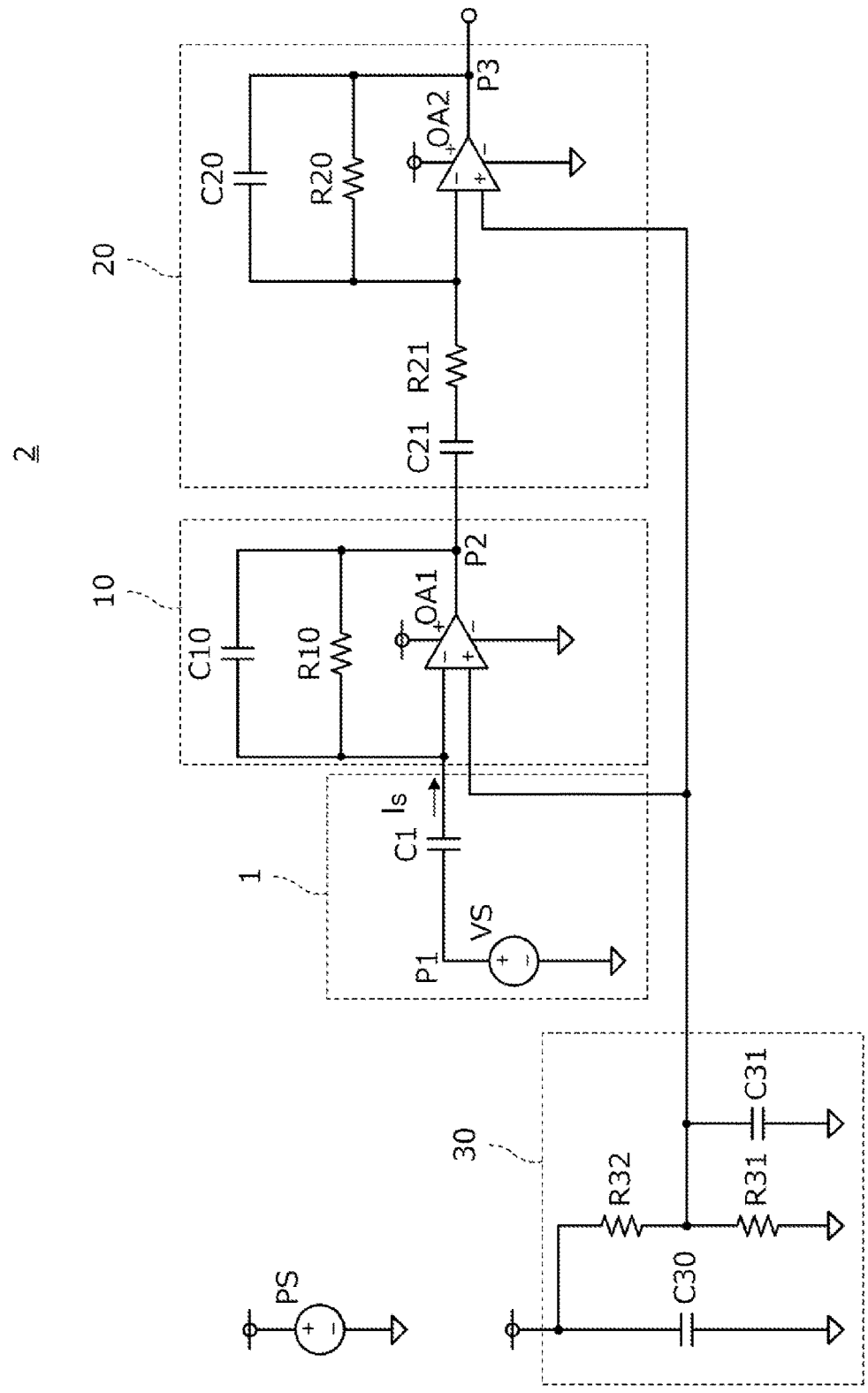
FIG. 2 is a circuit diagram of a piezoelectric sensor 1 and an analog circuit 2 of the pressing sensor 101 according to the first embodiment.
Figure 3:
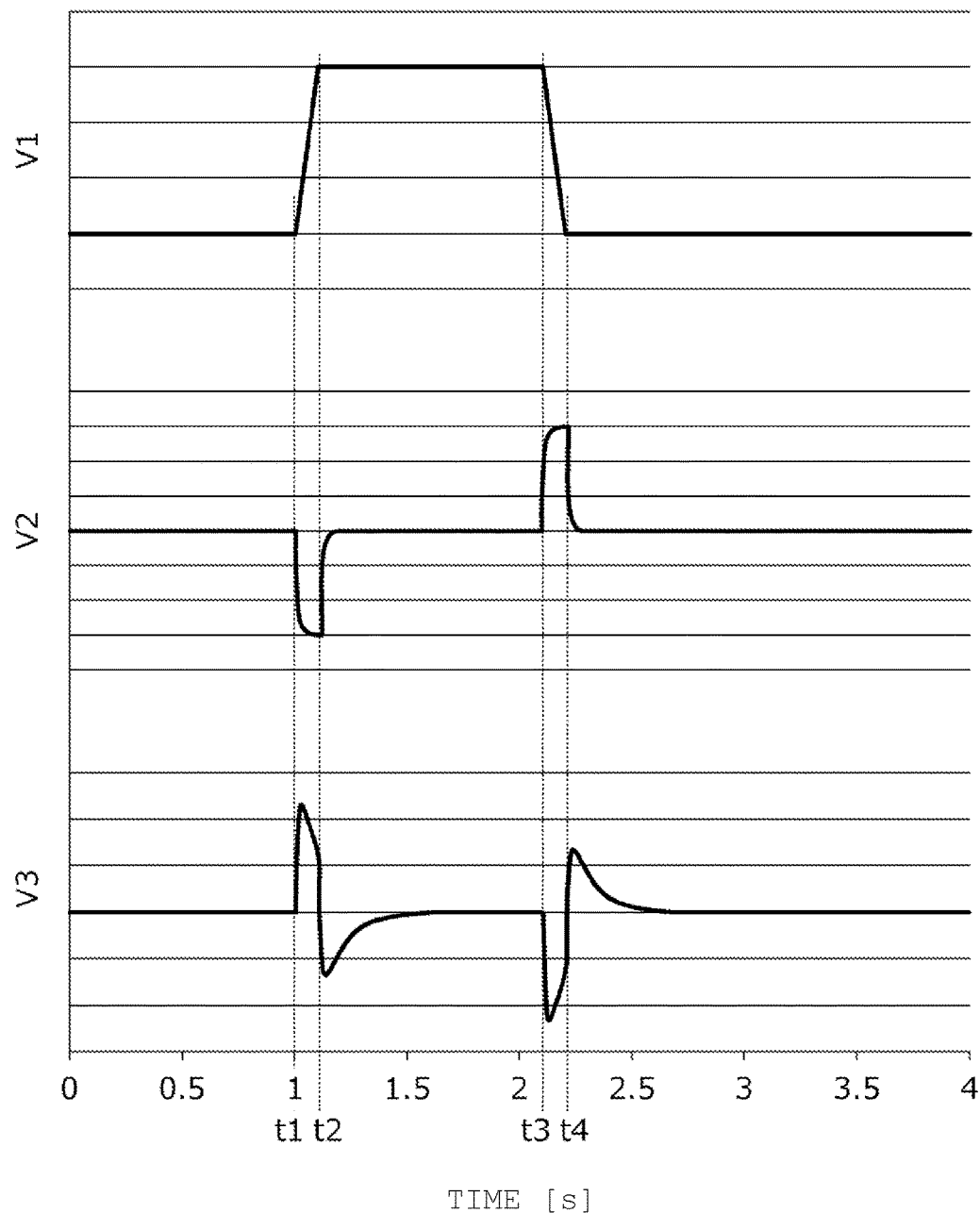
FIG. 3 is a schematic voltage waveform diagram of each part in FIG. 2.

FIG. 2 is a circuit diagram of the piezoelectric sensor 1 and the analog circuit 2 of the pressing sensor 101 according to the first embodiment. FIG. 3 is a schematic voltage waveform diagram of each part in FIG. 2. The analog circuit 2 includes a first current-voltage conversion circuit 10 and a second current-voltage conversion circuit 20. In the present embodiment, a power supply circuit PS and a reference potential generation circuit 30 are also provided.

The piezoelectric sensor 1 is an element that converts displacement due to pressing into a voltage and, as shown in FIG. 1, is equivalently represented by a voltage source VS and a capacitance C1 connected in series with the voltage source VS. The piezoelectric sensor 1 can also be represented by a current source and a capacitance connected in parallel to the current source. It should be appreciated that both are equivalently the same.

The power supply circuit PS generates a constant power supply voltage. The reference potential generation circuit 30 includes capacitances C30 and C31 and resistors R31 and R32 and generates a voltage that is ½ the power supply voltage generated by the power supply circuit PS.

As described below, the first current-voltage conversion circuit 10 converts a charge/discharge current for the capacitance C1 of the piezoelectric sensor 1 into a voltage signal and outputs a voltage signal. The first current-voltage conversion circuit 10 includes an operational amplifier OA1, a feedback resistor R10, and a compensation capacitance C10. The feedback resistor R10 and the compensation capacitance C10 are connected between an output end and an inverting input end of the operational amplifier OA1, respectively. A reference potential generated by the reference potential generation circuit 30 is input to a non-inverting input end of the operational amplifier OA1, and the piezoelectric sensor 1 is connected between an inverting input end and a ground.

At a point P1 in FIG. 2, a voltage proportional to a pressing force appears due to the piezoelectric effect of the piezoelectric sensor. A charge/discharge current $I_s$ of the capacitance C1 of the piezoelectric sensor 1 itself changes according to the voltage at the point P1. The charge/discharge current $I_s$ flows through the feedback resistor R10. When a resistance value of the feedback resistor R10 is represented by Rf, a voltage at a point P2 is represented by V2, and the reference potential is represented by Vm, the relationship of $V2=Vm-Rf \cdot I_s$ is established. That is, a proportional voltage signal of a charge/discharge current for the capacitance C1 of the piezoelectric sensor 1 appears at the point P2.

The charge/discharge current for the capacitance C1 of the piezoelectric sensor 1 corresponds to a change amount (i.e., a differential) of the voltage at the point P1. The compensation capacitance C10 is provided to impart low-pass filter characteristics to frequency characteristics of current-voltage conversion. Thus, an overshoot with respect to a step response is suppressed.

As described below, the second current-voltage conversion circuit 20 current-voltage converts a current corresponding to a change rate of an output voltage of the first current-voltage conversion circuit 10 and outputs a voltage signal. The second current-voltage conversion circuit 20 includes a capacitance C21, a resistor R21, an operational amplifier OA2, a feedback resistor R20, and a compensation capacitance C20. The feedback resistor R20 and the compensation capacitance C20 are connected in parallel and between an output end and an inverting input end of the operational amplifier OA2, respectively. A reference potential is input to a non-inverting input end of the operational amplifier OA2, and a series circuit of the capacitance C21 and the resistor R21 is inserted between the inverting input end and the point P2.

According to the exemplary aspect, a low frequency component of an output signal of the first current-voltage conversion circuit 10 is cut by the capacitance C21. The voltage at the point P2 is amplified by the operational amplifier OA2 to generate a voltage signal at a point P3. However, since a charge/discharge current of the capacitance C21 due to a voltage change at the point P2 flows through the feedback resistor R20, a voltage at the point P3 corresponds to a change amount (i.e., a differential) of the voltage at the point P2.

The first current-voltage conversion circuit 10 and the second current-voltage conversion circuit 20 form a two-stage amplifier circuit.

In FIG. 3, a voltage V1 represents the voltage at the point P1, a voltage V2 represents the voltage at the point P2, and a voltage V3 represents the voltage at the point P3. In the example in FIG. 3, pressing against the pressing portion is started at time t1, the pressing force is held from time t2 to t3, and the pressing is canceled at time t4. The voltage V1 at the point P1 corresponds to a time course profile (i.e., a pressing profile) of the pressing force. The voltage V2 at the point P2 corresponds to a differential waveform of V1, and the voltage V3 at the point P3 corresponds to a differential waveform of the voltage V2. That is, an output waveform of the analog circuit 2 is a waveform close to a second-order differential of a pressing profile. As will be described below, a data sequence close to the pressing profile is obtained by performing a second-order integration of an output voltage signal of the analog circuit 2.

Figure 4:
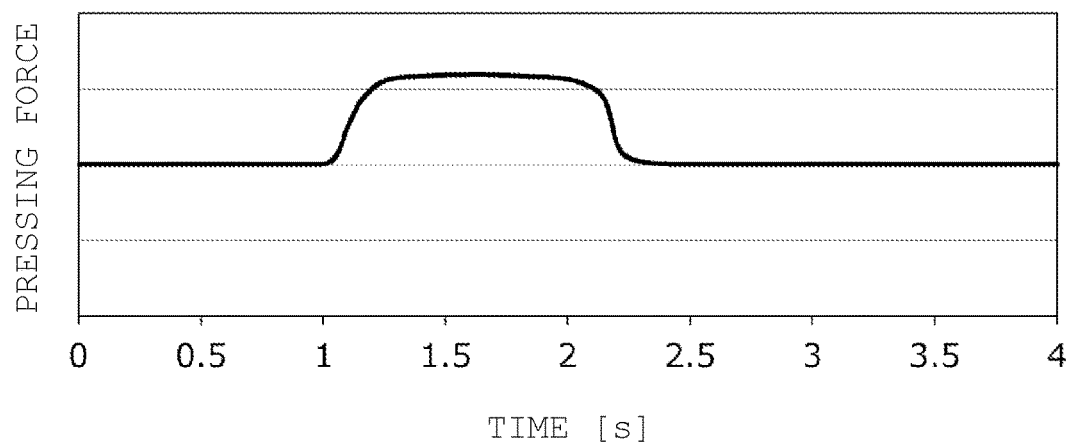
FIG. 4(A) is a diagram showing a data sequence after second-order integration as a time waveform.
FIG. 4(B) is a diagram showing a data sequence after second-order integration by a pressing sensor of a comparative example as a time waveform.
Figure 4:
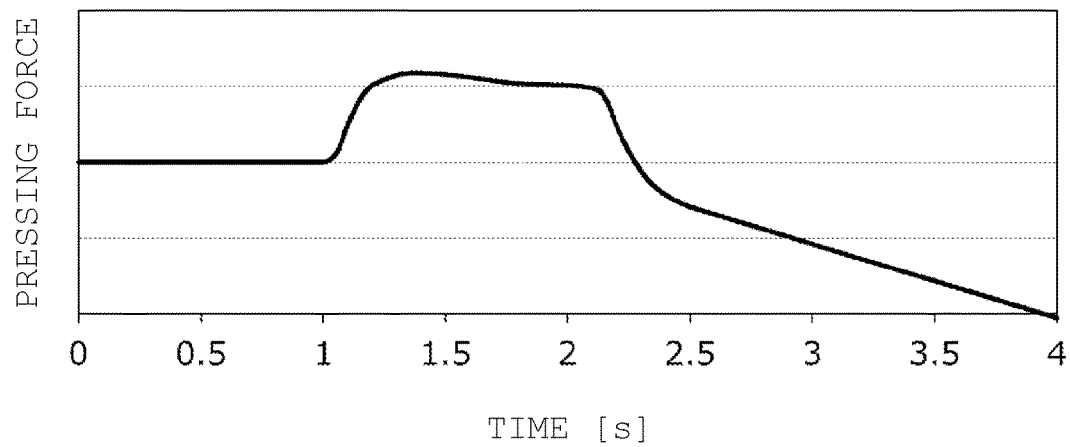

FIG. 4(A) is a diagram showing the data sequence after the second-order integration as a time waveform. FIG. 4(B) is a diagram showing a data sequence after second-order integration by a pressing sensor of a comparative example as a time waveform. Here, an accumulation result of an integration error is shown. According to the present embodiment, a pressing profile obtained by second-order integration has a shape approximating a trapezoid shape shown in FIG. 3. On the other hand, if integration errors are accumulated, as shown in FIG. 4(B), the pressing profile gradually deviates from an actual pressing profile as time elapses.

Figure 5:
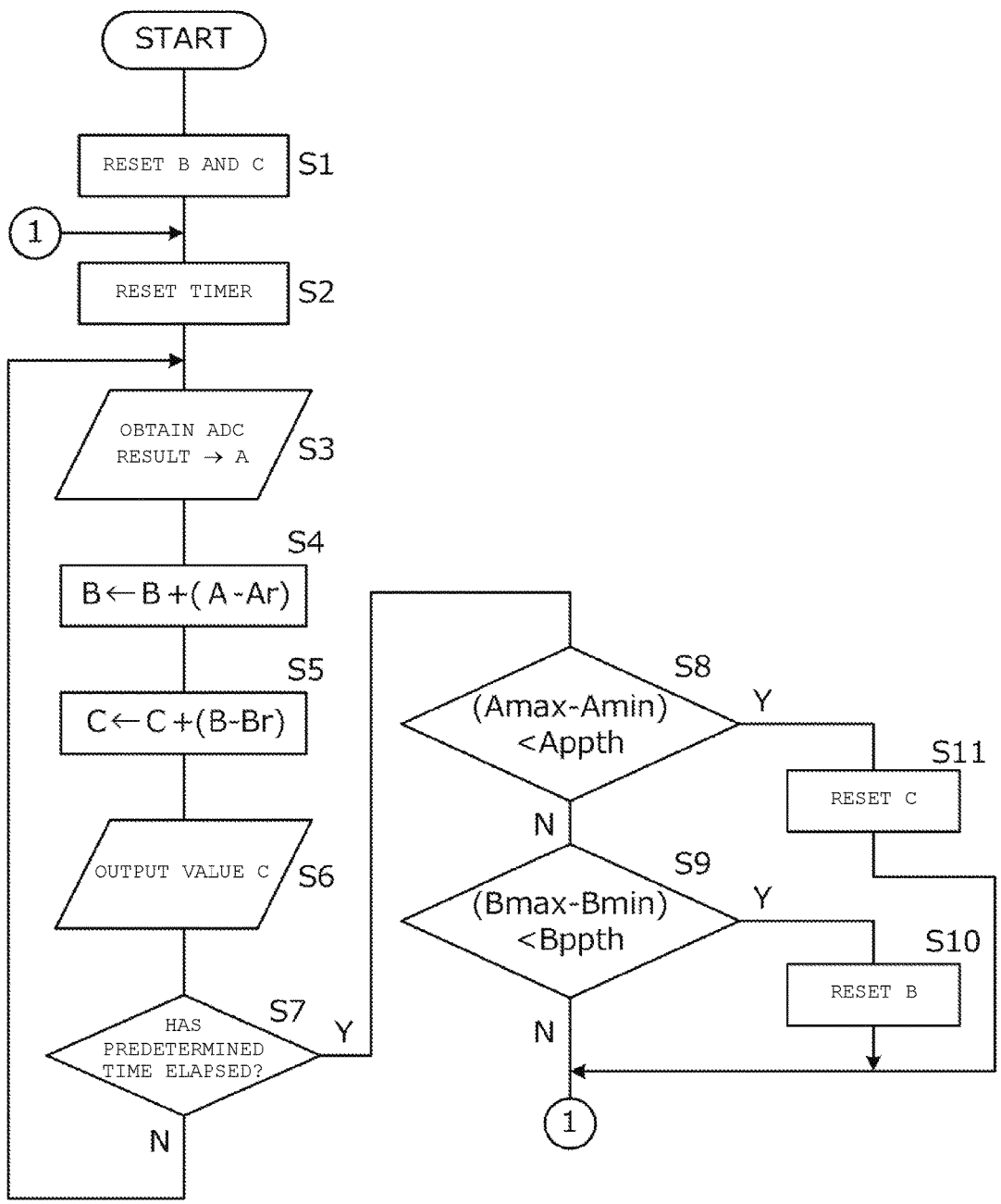
FIG. 5 is a flowchart showing processing contents of an arithmetic section 4 in the pressing sensor 101 shown in FIG. 1.

FIG. 5 is a flowchart showing processing contents of the arithmetic section 4 in the pressing sensor 101 shown in FIG. 1.

In FIG. 5, the meaning of each variable is as follows:
A: Value of AD conversion result
Ar: Reference value for integrating AD conversion value
Amax: Maximum value of AD conversion value at predetermined time
Amin: Minimum value of AD conversion value at predetermined time
Appth: Threshold for detection of presence/absence of minute vibration
B: First-order integrated value
Br: Reference value for integrating first-order integrated value B
Bmax: Maximum value of first-order integrated value at predetermined time
Bmin: Minimum value of first-order integrated value at predetermined time
Bppth: Threshold for detection of stabilization of first-order integrated value
C: Second-order integrated value As shown in FIG. 5, a first-order integrated value B and a second-order integrated value C are reset (S1). A timer is reset to start counting from an initial value (S2). Subsequently, an AD conversion result is placed in a variable A (S3). Then, the first-order integrated value B is updated by adding a difference between an AD conversion value A and its reference value Ar to a variable B (S4). The second-order integrated value C is updated by adding a difference between the first-order integrated value B and its reference value Br to a variable C, and the second-order integrated value C is output (from S5 to S6). The above processing is repeated (by a predetermined number of data) until a predetermined time has elapsed (from S7 returning to S3 and so forth until the predetermined time has been determined to have elapsed at S7).

When the predetermined time has elapsed, it is determined whether or not a difference between a maximum value and a minimum value (Amax−Amin) of the AD conversion value is less than a threshold Appth (for the predetermined number of data) within the predetermined time (S8). If the result is not (Amax−Amin)<Appth (i.e., S8=No), it is determined whether or not a difference between a maximum value and a minimum value (Bmax−Bmin) of the first-order integrated value B is less than a threshold Bppth within a predetermined time (for the predetermined number of data) (S9). If the result is not (Bmax−Bmin)<Bppth (i.e., S9=No), the flowchart returns to the processing at step S2 and subsequent steps are performed.

If (Bmax−Bmin)<Bppth in step S9 (i.e., S9=Yes), the first-order integrated value B is reset (from S9 to S10). According to an exemplary aspect, steps S9 and S10 can be executed by a "first-order integration reset processor", for example.

If (Amax−Amin)<Appth in step S8 (i.e., S8=Yes), that is, if no minute vibration state is found, the second-order integrated value C is reset (from S8 to S11). Steps S8 and S11 can be executed by an "integration reset processor" according to an exemplary aspect, for example.

In this way, cumulative error of second-order integration is canceled by resetting the second-order integrated value C in response to non-detection of the minute vibration. In the present embodiment, cumulative error of first-order integration is also canceled by resetting the first-order integrated value B in accordance with stabilization of the first-order integrated value B.

Next, an example of operation at the time of an actual pressing operation with minute vibration will be described. FIGS. 6 to 9 are diagrams showing an output voltage waveform of the analog circuit 2 and a voltage waveform of an integration calculation result.

Figure 6:
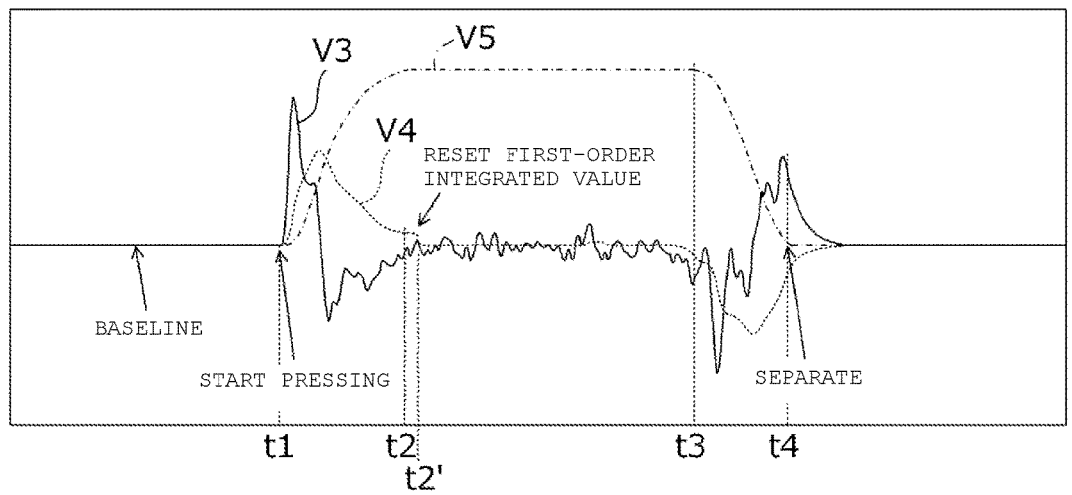
FIG. 6 is an example in which pressing against a pressing portion is started at time t1, the pressing force is held from time t2 to t3, and the pressing is canceled at time t4.

FIG. 6 is an example in which pressing against the pressing portion is started at the time t1, the pressing force is held from the time t2 to t3, and the pressing is canceled at the time t4. In FIG. 6, a voltage V4 is a first-order integrated value (a value obtained by integrating a difference from a baseline of the voltage V3) of the output voltage V3 of the analog circuit 2 and is represented as a voltage waveform. A voltage V5 is a second-order integrated value (a value obtained by integrating a difference from the baseline of the voltage V4) of the output voltage V3 of the analog circuit 2 and is represented as a voltage waveform. The second-order integrated value is obtained by reproducing the time course profile (pressing profile) of the pressing force.

From FIG. 6, it can be seen that the output voltage V3 of the analog circuit minutely fluctuates during pressing, and there is no minute fluctuation when separated. If a change rate of the pressing force decreases, a change rate of the first-order integrated value V4 decreases. When the change rate of the first-order integrated value V4 is lower than a predetermined threshold at time t2', the first-order integrated value V4 is reset (from steps S9 to S10 in FIG. 5). With this configuration, a second-order integrated value V5 does not diverge.

In the example of FIG. 6, since the second-order integrated value V5 has returned to 0 (baseline) after the time t4 (after canceling pressing), the second-order integrated value V5 is not reset.

Figure 7:
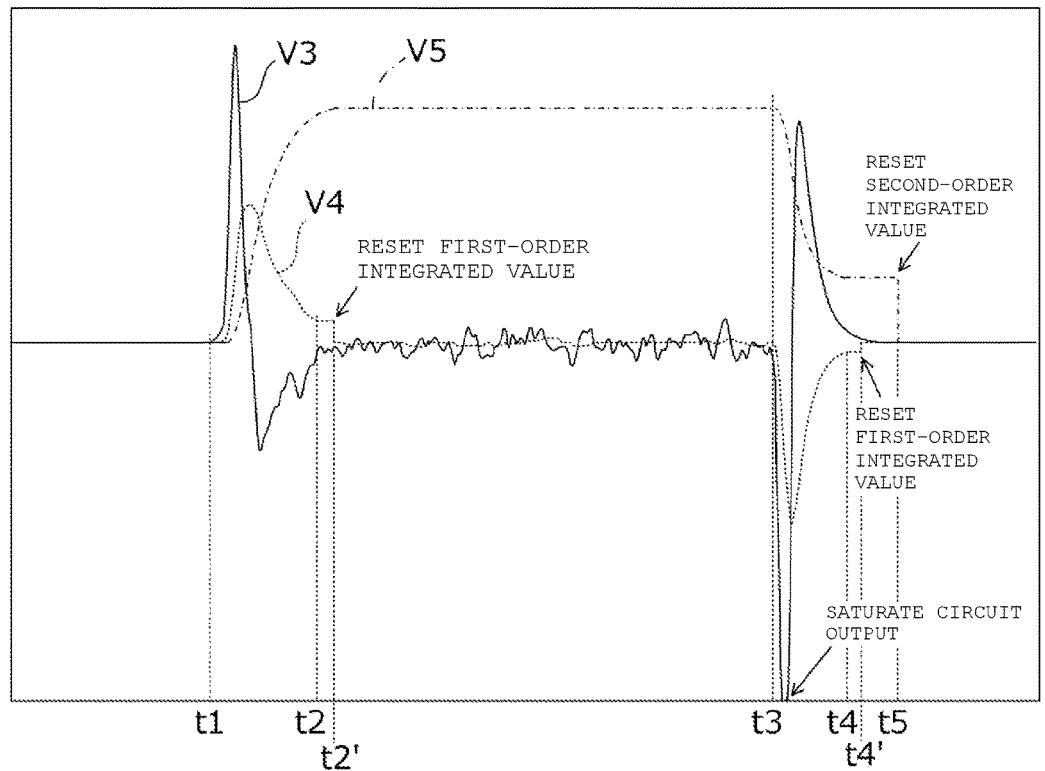
FIG. 7 is an example in which pressing against the pressing portion is started at the time t1, the pressing force is held from the time t2 to t3, and the pressing is canceled at the time t4.

FIG. 7 is an example in which pressing against the pressing portion is started at the time t1, the pressing force is held from the time t2 to t3, and the pressing is canceled at the time t4. In this example, when pressing is abruptly canceled at the time t3 after strong pressing, the output voltage V3 is saturated beyond an operating range of the analog circuit 2. Thus, after canceling pressing, a large error occurs in the second-order integrated value V5. However, at time t5, it is detected that the minute fluctuation of the voltage V3 disappears, and the second-order integrated value V5 is reset (from steps S8 to S11 in FIG. 5).

In the example of FIG. 7, since the change rate of the first-order integrated value V4 is lower than the predetermined threshold at time t4', the first-order integrated value V4 is reset at that timing.

Figure 8:
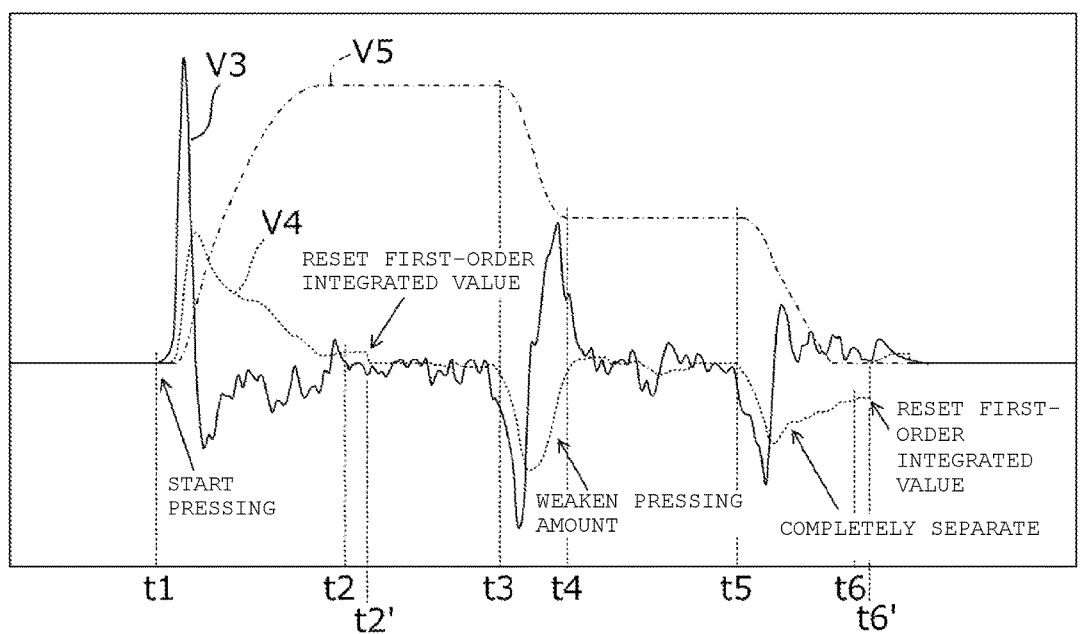
FIG. 8 is an example in which pressing against the pressing portion is started at the time t1, the pressing force is held from the time t2 to t3, the pressing force is weakened between the time t3 and the time t4, the pressing force is held until time t5, and the pressing force is gradually canceled between the time t5 and the time t6.

FIG. 8 is an example in which pressing against the pressing portion is started at the time t1, the pressing force is held from the time t2 to t3, the pressing force is weakened between the time t3 and the time t4, the pressing force is held until the time t5, and the pressing force is gradually canceled between the time t5 and time t6. In this example, the change rate of the first-order integrated value V4 is lower than the predetermined threshold at times t2' and t6', and the first-order integrated value V4 is reset. In the example, since the second-order integrated value V5 has returned to 0 (baseline) after the time t6 (after canceling pressing), the second-order integrated value V5 is not reset.

Figure 9:
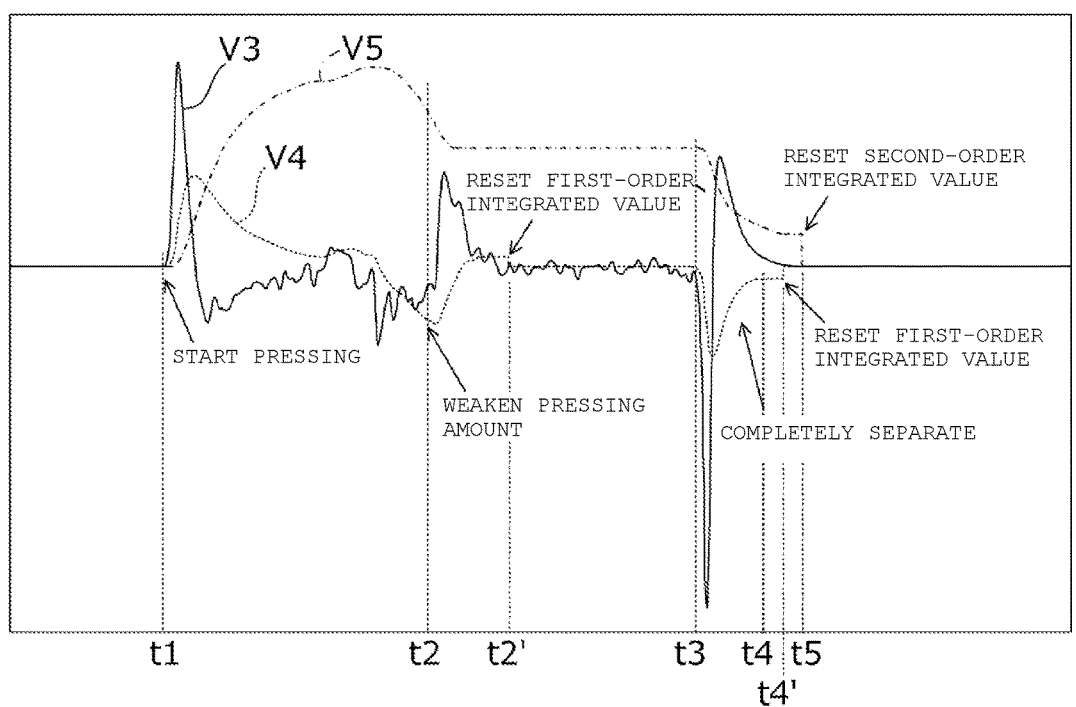
FIG. 9 is an example in which pressing against the pressing portion is started at the time t1, the pressing force is stabled from the time t2 to t3, the pressing force is weakened at the time t3, and the pressing force is canceled at the time t4.

FIG. 9 is an example in which pressing against the pressing portion is started at the time t1, the pressing force is stabled from the time t2 to t3, the pressing force is weakened at the time t3, and the pressing force is canceled at the time t4. In this example, at the time t5, it is detected that the minute fluctuation of the voltage V3 disappears, and the second-order integrated value V5 is reset. The change rate of the first-order integrated value V4 is lower than the predetermined threshold at the time t2' and t4', and the first-order integrated value V4 is reset.

Second Embodiment

In the second embodiment, a pressing sensor with first-order differential and first-order integration is shown.

Figure 10:
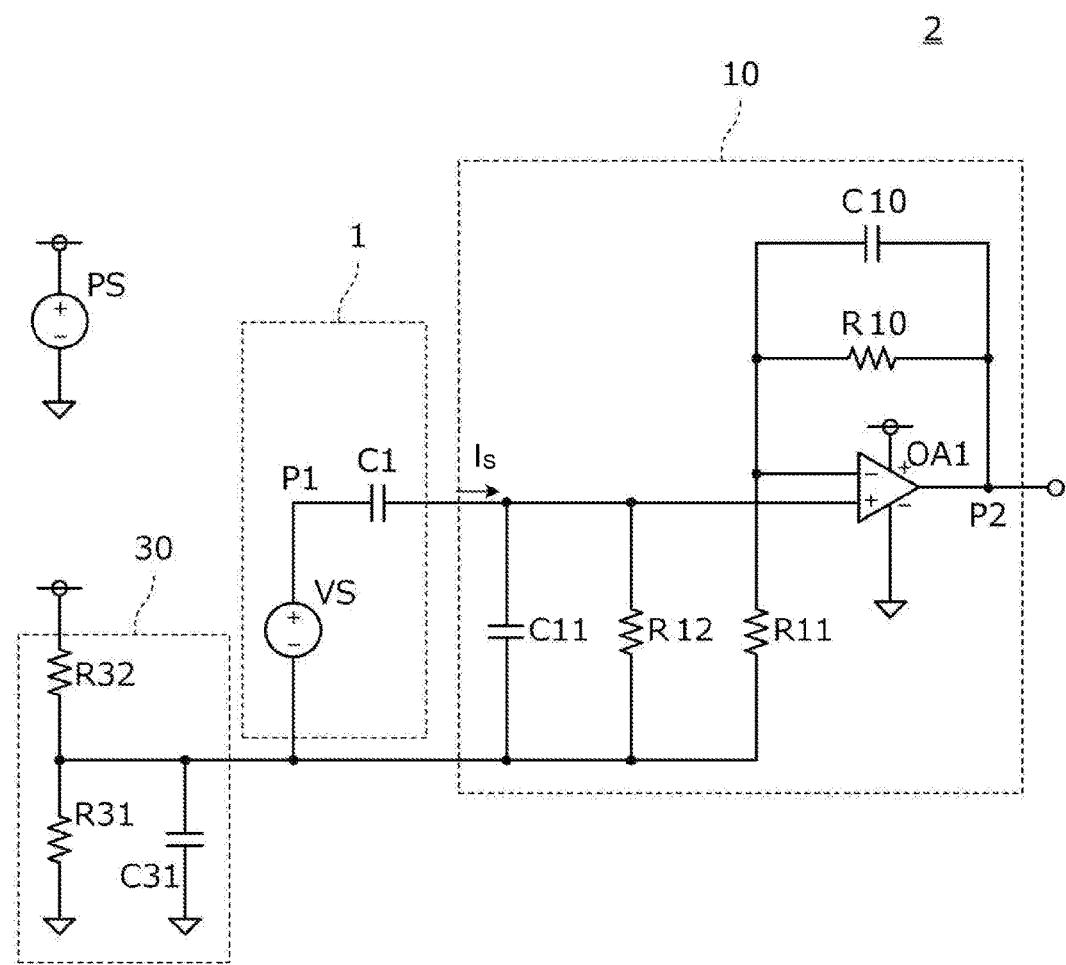
FIG. 10 is a circuit diagram of a piezoelectric sensor 1 and an analog circuit 2 of a pressing sensor according to the second embodiment.
Figure 11:
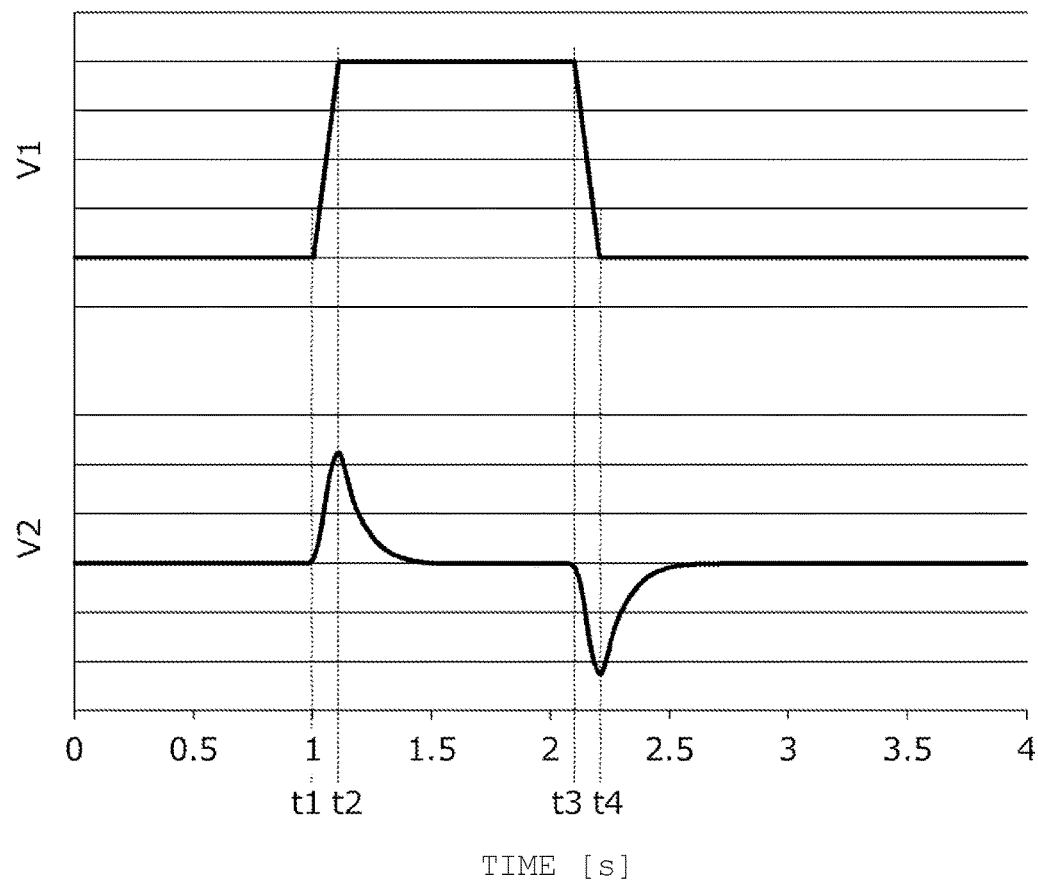
FIG. 11 is a schematic voltage waveform diagram of each part in FIG. 10.

FIG. 10 is a circuit diagram of a piezoelectric sensor 1 and an analog circuit 2 of a pressing sensor according to the second embodiment. FIG. 11 is a schematic voltage waveform diagram of each part in FIG. 10. The analog circuit 2 includes a first current-voltage conversion circuit 10. In the present embodiment, a power supply circuit PS and a reference potential generation circuit 30 are also provided. The configurations of the piezoelectric sensor 1 and the reference potential generation circuit 30 are the same as those shown in FIG. 2 in the first embodiment. When the overall configuration of the pressing sensor is illustrated by a block diagram, it is as shown in FIG. 1.

The first current-voltage conversion circuit 10 includes an operational amplifier OA1, a feedback resistor R10, and a compensation capacitance C10. The feedback resistor R10 and the compensation capacitance C10 are connected between an output end and an inverting input end of the operational amplifier OA1, respectively. A resistor R11 is connected between the inverting input end of the operational amplifier OA1 and a reference potential. The piezoelectric sensor 1 is connected between a non-inverting input end of the operational amplifier OA1 and a ground. A capacitance C11 and a resistor R12 are connected between the non-inverting input end of the operational amplifier OA1 and the ground, respectively.

The first current-voltage conversion circuit 10 includes a non-inverting amplifier circuit with the operational amplifier OA1, the feedback resistor R10, the compensation capacitance C10, and the resistor R11. The capacitance C11 is a capacitance for charging (smoothing) the output voltage of the piezoelectric sensor 1, and the resistor R12 is a resistor for discharging charge of the capacitance C11.

At a point P1 in FIG. 10, a voltage proportional to a pressing force appears due to the piezoelectric effect of the piezoelectric sensor. A charge/discharge amount is of the capacitance C1 of the piezoelectric sensor 1 itself changes according to the voltage at the point P1. The charge/discharge current $I_s$ flows through the resistor R10.

When a piezoelectric constant of the piezoelectric sensor 1 is large and a gain of an amplifier circuit in the subsequent stage can be small, it is sufficient to provide only one stage of the amplifier circuit as in the present embodiment. With this configuration, an output voltage of the analog circuit 2 is a waveform close to a first-order differential of a pressing profile.

In FIG. 11, a voltage V1 represents the voltage at the point P1, and a voltage V2 represents the voltage at the point P2. In the example in FIG. 11, pressing against the pressing portion is started at time t1, the pressing force is held from time t2 to t3, and the pressing is canceled at time t4. The voltage V1 at the point P1 corresponds to the pressing profile. The voltage V2 at the point P2 corresponds to a differential waveform of the voltage V1. That is, an output waveform of the analog circuit 2 is a waveform close to a first-order differential of the pressing profile. As will be described later, a data sequence close to the pressing profile is obtained by performing a first-order integration of an output voltage signal of the analog circuit 2.

Figure 12:
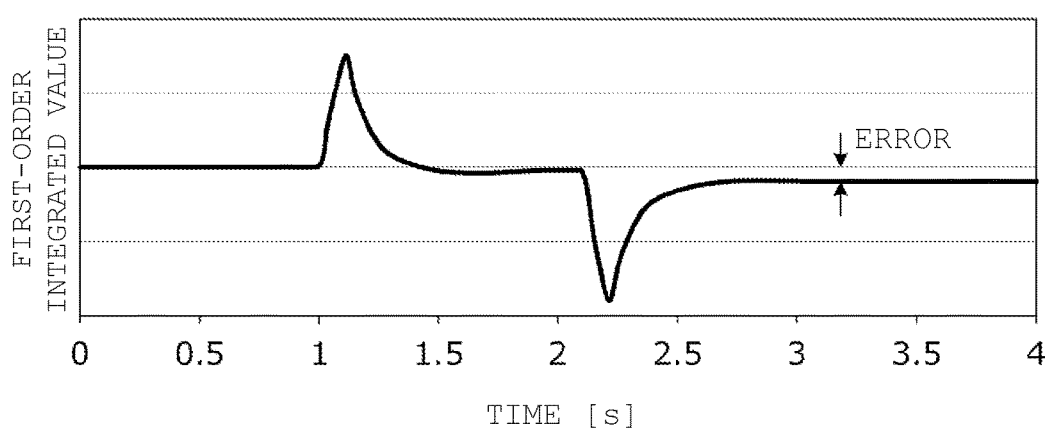
FIG. 12 is a diagram showing a data sequence after first-order integration by a pressing sensor of a comparative example as a time waveform.

FIG. 12 is a diagram showing a data sequence after first-order integration by a pressing sensor of a comparative example as a time waveform. Here, an accumulation result of an integration error is shown. According to the present embodiment, a pressing profile obtained by first-order integration has a shape approximating a trapezoid shape shown in FIG. 11. On the other hand, if integration errors are accumulated, the pressing profile gradually deviates from an actual pressing profile as time elapses.

Figure 13:
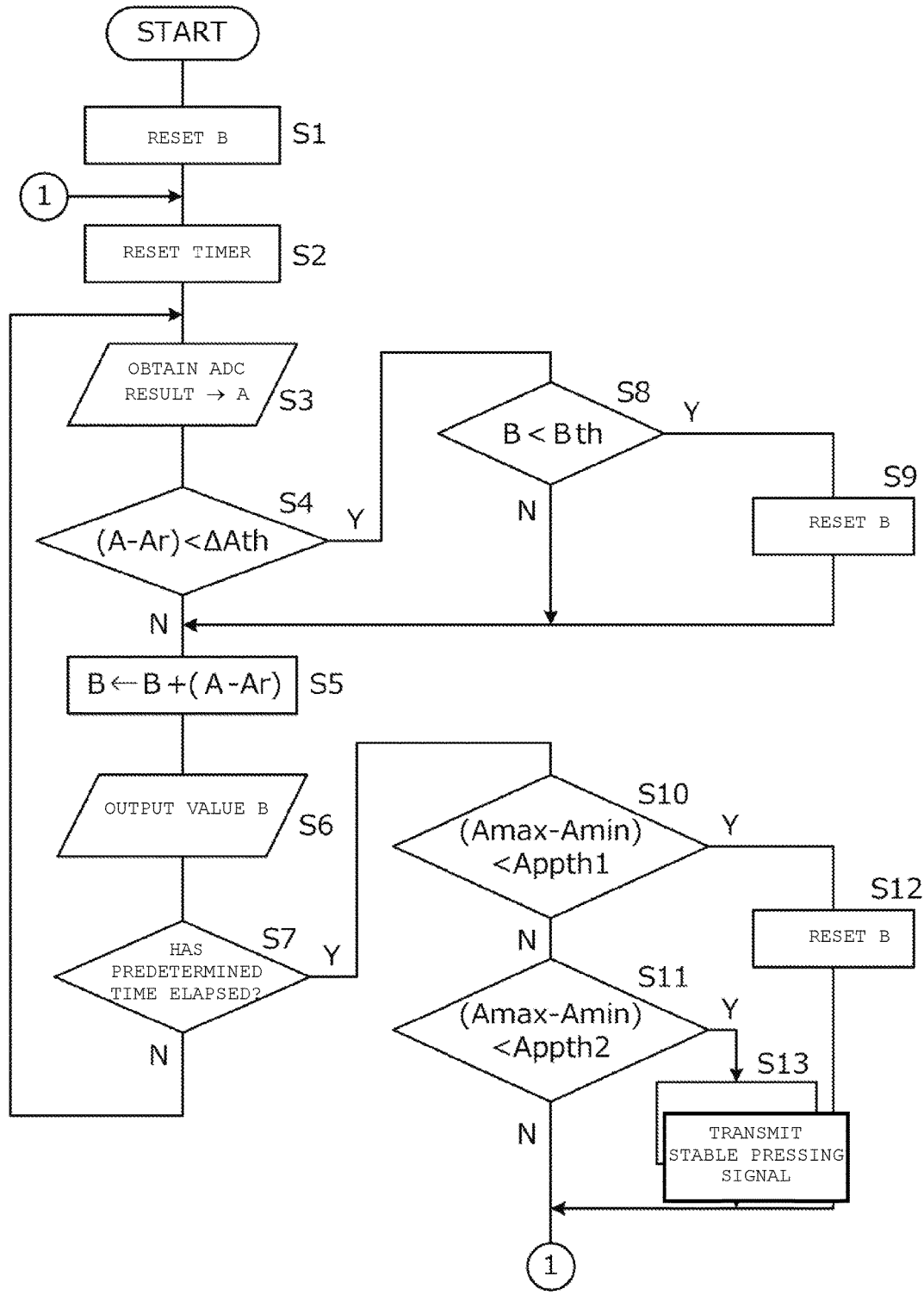
FIG. 13 is a flowchart showing processing contents of an arithmetic section in the pressing sensor according to the second embodiment.

FIG. 13 is a flowchart showing processing contents of an arithmetic section in the pressing sensor according to the second embodiment.

In FIG. 13, the meaning of each variable is as follows:

A: Value of AD conversion result

Ar: Reference value for integrating AD conversion value

Amax: Maximum value of AD conversion value at predetermined time

Amin: Minimum value of AD conversion value at predetermined time

Appth1: Threshold for detection of presence/absence of minute vibration

Appth2: Threshold for detection of presence/absence of minute vibration

ΔAth: Threshold for detecting that change amount of AD conversion value is small B: First-order integrated value ΔBth: Threshold for detecting that first-order integrated value is small As shown in FIG. 13, a first-order integrated value B is first reset (S1). A timer is reset to start counting from an initial value (S2). Subsequently, an AD conversion result is placed in a variable A (S3). It is determined whether or not a difference between an AD conversion value A and its reference value Ar is less than a threshold ΔAth, and if (A−Ar)≥ΔAth, the difference between the AD conversion value A and its reference value Ar is added to a variable B to update the first-order integrated value B (from S4 to S5). Then, the first-order integrated value B is output (S6). The above processing is repeated (by a predetermined number of data) until a predetermined time has elapsed (from S7 returning to S3 and so forth until the predetermined time has been determined to have elapsed at S7).

If (A−Ar)<ΔAth (S4), it is determined whether or not the first-order integrated value B is less than a threshold Bth (S8). If the first-order integrated value B is less than the threshold Bth, the first-order integrated value B is reset (from S4 to S8 to S9).

When the predetermined time has elapsed at S7, it is determined whether or not a difference between a maximum value and a minimum value (Amax−Amin) of the AD conversion value is less than a threshold Appth1 (for the predetermined number of data) within the predetermined time (from S7 to S10). If (Amax−Amin)<Appth1, that is, if no minute vibration state is found, the first-order integrated value B is reset (from S10 to S12). In an exemplary aspect, steps S10 and S12 are executed by an "integration reset processor", for example.

The two thresholds Appth1 and Appth2 for detection of presence/absence of minute vibration are in the following relationship.

Appth1<Appth2

Appth1 corresponds to a lower limit of minute vibration, and Appth2 corresponds to an upper limit of the minute vibration. If a fluctuation width of the AD conversion value is within the range from Appth1 to Appth2, it is regarded as a minute vibration state, that is, a pressing state with a constant pressing force, and a signal indicating this is output (from S10 to S11 to S13). In an exemplary aspect, steps S10 and S11 can be executed by a "minute vibration sensor", for example.

In this way, cumulative error of first-order integral is canceled by resetting the first-order integrated value B in response to non-detection of the minute vibration.

When the minute vibration detector detects a minute vibration state of the pressing portion, this state is a stable pressing state according to a human body, so that processing peculiar to pressing according to the human body can be performed by the above configuration. In addition, since presence or absence of operation by the human body is detected by detection of minute vibration, even in a state where pressing is performed with a stable pressing force in a state where the pressing force is weak or a state where the pressing force changes slowly, presence or absence of the operation by the human body can be detected.

Figure 14:
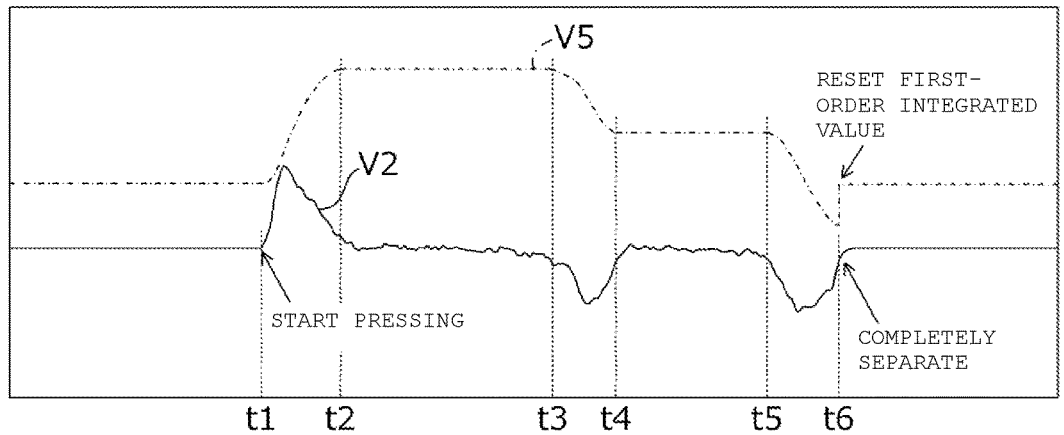
FIG. 14 is an example in which pressing against the pressing portion is started at the time t1, the pressing force is held from the time t2 to t3, the pressing force is weakened between the time t3 and the time t4, the pressing force is held until time t5, and the pressing force is gradually canceled between the time t5 and time t6.
Figure 15:
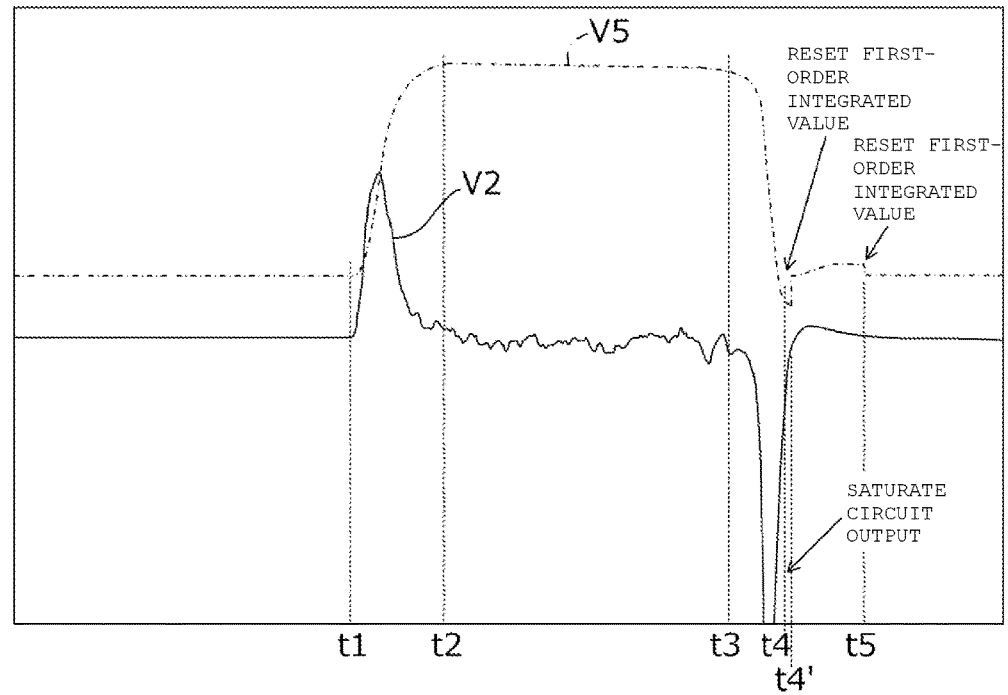
FIG. 15 is an example in which pressing against the pressing portion is started at the time t1, the pressing force is held from the time t2 to t3, and the pressing is canceled at the time t4.

Next, operation at the time of an actual pressing operation with minute vibration will be described. FIGS. 14 and 15 are diagrams showing an output voltage waveform of the analog circuit 2 and a voltage waveform of an integration calculation result.

FIG. 14 is an example in which pressing against the pressing portion is started at the time t1, the pressing force is held from the time t2 to t3, the pressing force is weakened between the time t3 and the time t4, the pressing force is held until time t5, and the pressing force is gradually canceled between the time t5 and time t6. In FIG. 14, a voltage V5 is a first-order integrated value (a value obtained by integrating a difference from a baseline of the voltage V2) of the output voltage V2 of the analog circuit 2 and is represented as a voltage waveform. The first-order integrated value is obtained by reproducing a time course profile (pressing profile) of the pressing force.

From FIG. 14, it can be seen that the output voltage V2 of the analog circuit minutely fluctuates during pressing, and is stabilized when separated. At the time t6, it is detected that the minute fluctuation of the voltage V2 disappears, and the first-order integrated value V5 is reset (from steps S10 to S12 in FIG. 13).

FIG. 15 is an example in which pressing against the pressing portion is started at the time t1, the pressing force is held from the time t2 to t3, and the pressing is canceled at the time t4. In this example, when pressing is canceled between the time t3 and the time t4 after strong pressing, the output voltage V2 is saturated beyond an operating range of the analog circuit 2. Thus, after canceling pressing, a large error occurs in the first-order integrated value V5. However, at the time t5, it is detected that the minute fluctuation of the voltage V2 disappears, and the first-order integrated value V5 is reset (from steps S10 to S12 in FIG. 13).

In the example of FIG. 15, when a change rate of the first-order integrated value V5 is lower than a predetermined threshold at time t4', the first-order integrated value V5 is reset (from steps S8 to S9 in FIG. 13).

Third Embodiment

In the third embodiment, an example in which a processing content is selected according to presence or absence of a stable pressing state and magnitude classification of the pressing force is shown.

Figure 16:
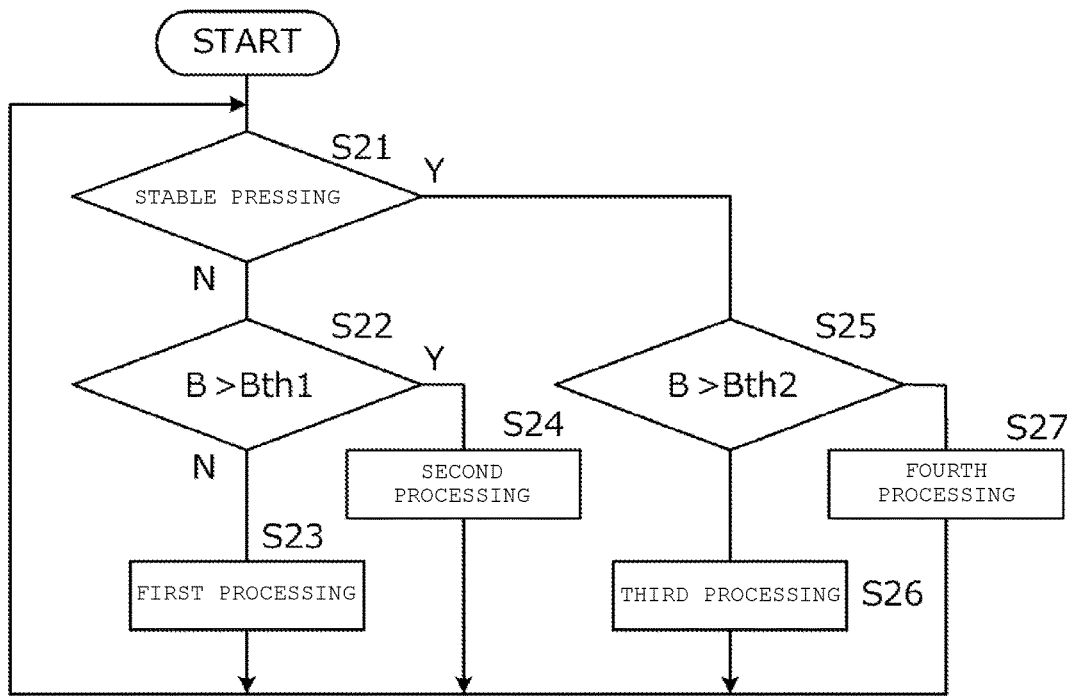
FIG. 16 is a flowchart showing processing contents of an arithmetic section in a pressing sensor according to a third embodiment.

FIG. 16 is a flowchart showing processing contents of an arithmetic section in a pressing sensor according to the third embodiment. The configurations other than arithmetic processing by the arithmetic section shown in FIG. 16 are the same as the configurations of the pressing sensor shown in the first or second embodiment.

For example, in the second embodiment, as the processing contents of the arithmetic section shown in FIG. 13, presence or absence of the stable pressing state is detected, and the deformation amount of the pressing portion (the magnitude of the pressing force) is detected. On the other hand, as an example of the processing contents shown in FIG. 16 of the third embodiment, the processing content is selected according to presence or absence of the stable pressing state and the magnitude classification of the pressing force.

In particular, in FIG. 16, a variable B is the first-order integrated value shown in the second embodiment and corresponds to the pressing force. The variables Bth1 and Bth2 are predetermined thresholds for classifying the magnitude of the variable B.

As shown in FIG. 16, the following processing is performed according to presence or absence of the stable pressing state and the magnitude classification of the pressing force.

| State | Stable pressing state | Pressing force | Processing content |
| --- | --- | --- | --- |
| 1 | Unstable | Small | First processing |
| 2 | Unstable | Large | Second processing |
| 3 | Stable | Small | Third processing |
| 4 | Stable | Large | Fourth processing |

[State 1] is, for example, the time of transition of start or cancel of pressing, and the first processing is processing corresponding thereto. [State 2] is a state where relatively strong pressing is performed and the pressing force is fluctuating, and the second processing is processing corresponding thereto. [State 3] is a state where light pressing continues, and the third processing is processing corresponding thereto. [State 4] is a state where strong pressing continues, and the fourth processing is processing corresponding thereto.

For example, in an application in which enlargement/reduction display of a map is performed by pressing operation, if the display magnification of the map is gradually increased by stable and strong pressing, and if the increase of the display magnification is stopped when pressing is canceled, the fourth processing is processing of increasing the display magnification, and the third processing is processing of reducing the display magnification. The first processing and the second processing are other processings in this example.

If the display magnification of the map starts to increase when stable and strong pressing is performed, if the display magnification continues to increase even when the pressing is canceled, and if the increase of the display magnification is stopped when light touch is performed, the fourth processing is processing of starting the increase of the display magnification, and the third processing is processing of stopping the changing of the display magnification. The first processing and the second processing are other processings in this example.

According to the present embodiment, since whether or not operation is a stable operation by a human body is discriminated depending on presence or absence of minute vibration, if the pressing portion of the electronic device is pressed by some object in a bag for example, an error operation does not occur.

Fourth Embodiment

In the fourth embodiment, an example of an electronic device including a pressing sensor is shown.

Figure 17:
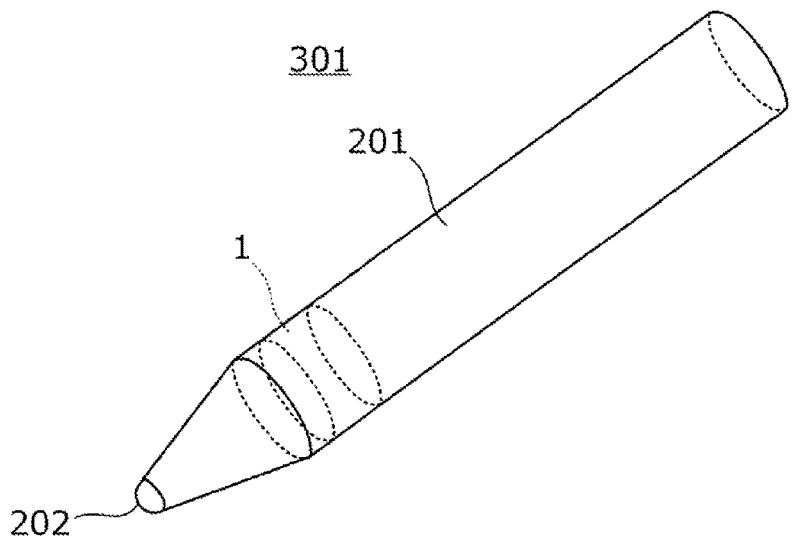
FIG. 17 is a perspective view of an electronic writing instrument 301 according to a fourth embodiment.
Figure 18:
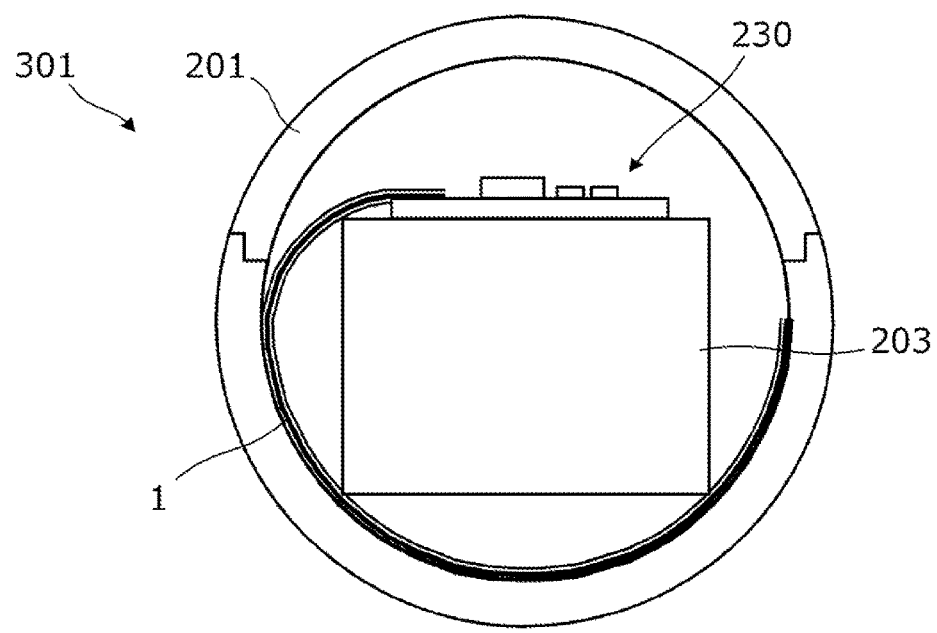
FIG. 18 is a cross-sectional view of the electronic writing instrument 301 shown in FIG. 17.
Figure 19:
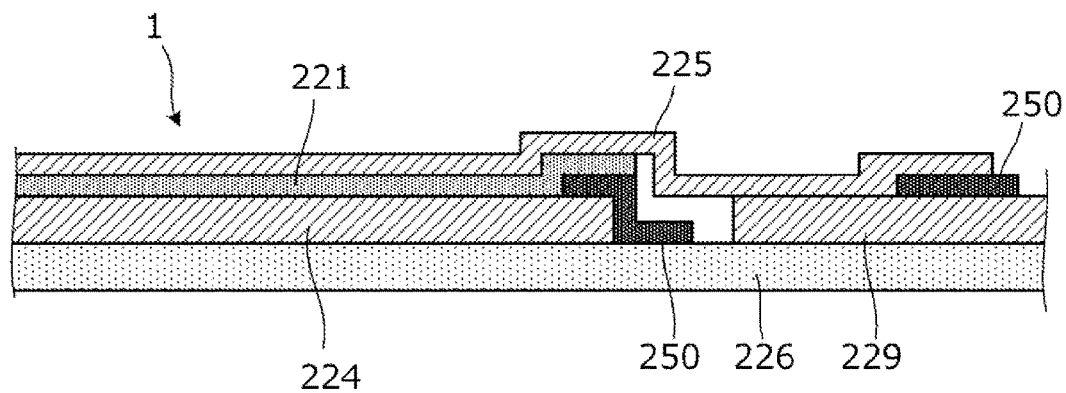
FIG. 19 is a partial cross-sectional view of a piezoelectric sensor 1.

FIG. 17 is a perspective view of an electronic writing instrument 301 according to the fourth embodiment. FIG. 18 is a cross-sectional view of the electronic writing instrument 301 shown in FIG. 17. FIG. 18 is a cross-sectional view of a region in the electronic writing instrument 301 where a piezoelectric sensor 1 and a circuit board 230 are mounted. FIG. 19 is a partial cross-sectional view of the piezoelectric sensor 1.

As shown in FIG. 17, the electronic writing instrument 301 includes the piezoelectric sensor 1 and a housing 201. As shown in FIGS. 18 and 19, in a state where the piezoelectric sensor 1 is connected to the circuit board 230, the circuit board 230 and the piezoelectric sensor 1 are provided in the housing 201.

The housing 201 has a cylindrical shape. The housing 201 is formed of an insulating material. As shown in FIG. 18, the housing 201 includes a substrate 203. As shown in FIG. 17, a tapered end portion 202 is provided at an end of the housing 201 in the longitudinal direction (the direction orthogonal to the circumferential direction).

It is sufficient that the housing 201 has adequate elasticity to the extent that its deformation can be transmitted to the piezoelectric sensor 1, and the housing 201 may be formed of a metal.

As shown in FIG. 19, the piezoelectric sensor 1 includes a substrate 226 having flexibility. A laminate of a first electrode 224, a piezoelectric film 221, and a second electrode 225 is applied onto the substrate 226. An end portion of the laminate of the first electrode 224, the piezoelectric film 221, and the second electrode 225 is reinforced by a coverlay 250. A third electrode 229 is formed on the substrate 226, and the second electrode 225 is electrically connected to the third electrode 229. A plurality of electrodes formed on the substrate 226 are connected to the circuit board 230.

As shown in FIG. 18, the piezoelectric sensor 1 is mounted in a curved state along a circumferential direction of an inner wall surface of the housing 201.

According to the exemplary aspect, the piezoelectric film 221 is formed of PLLA (L-type polylactic acid). PLLA is a chiral polymer, and the main chain has a helical structure. PLLA has piezoelectricity when the molecules are oriented by uniaxially stretching. A piezoelectric constant of uniaxially stretched PLLA falls into a category of extremely high piezoelectric constant in polymers.

In PLLA, the piezoelectricity is generated by orientation treatment of the molecules by stretching or the like, and there is no need to perform poling treatment unlike other polymers such as PVDF or piezoelectric ceramics. Specifically, piezoelectricity of PLLA that does not belong to ferroelectric appears not by ion polarization as in ferroelectric such as PVDF or PZT, but by a spiral structure that is a unique structure of molecules.

Therefore, PLLA has less pyroelectricity that is generated in other ferroelectric piezoelectric bodies. In addition, the piezoelectric constant of PLLA is extremely stable overtime, although PVDF, for example, has a variation overtime in a piezoelectric constant, and in some cases, the piezoelectric constant is significantly reduced.

When a third axis is arranged in a PLLA stretching direction, and a first axis and a second axis are arranged in a direction vertical to a third axis direction, PLLA has a piezoelectric constant of d14 (shear piezoelectric constant). The piezoelectric film 221 of a stripe shape is cut such that a first axis direction is a thickness direction, and a direction which forms an angle of 45° with respect to the third axis direction (stretching direction) is the longitudinal direction. Consequently, when the piezoelectric film 221 expands/contracts in the longitudinal direction, the piezoelectric film 221 is polarized in the thickness direction.

Since a deformation amount of the piezoelectric sensor 1 changes depending on whether or not the housing 201 is held by a user, the instrument detects whether or not the user is holding the housing 201 accordingly.

In the above-described embodiment, the electronic writing instrument is shown as an example of an electronic device in which a curved substrate is mounted in a housing, but it should be appreciated that this curved substrate is not a limitation. In implementation, the present embodiment can be applied to electronic devices such as a mouse, a tablet terminal, a smartphone, a wearable terminal (such as so-called smart watch, smart glasses, and head mount display) and the like.

For example, in the case of these electronic devices, the following control can be implemented.

When the human body is in contact with the electronic device and pressing is not performed, first control is executed. When pressing is performed, second control is executed. When the human body is in a noncontact state, the first control and the second control may not be executed. Thereby, it is possible to suppress execution of predetermined control when operation is performed irrespective of intention of a person. Here, "a state where the electronic device is in contact with the human body" includes a direct contact state and an indirect contact state and may be a condition where minute vibration of the human body is transmitted. The state where pressing is not performed includes a state where weak pressing is performed. Even if pressing is not intended when the human body is in contact, there is a possibility that weak pressing is performed, and the state is included.

For example, in wearable terminals, a wearable state on the human body corresponds to "the state where pressing is not performed". The "state where pressing is performed" is a state where an electronic device is intentionally pressed with a stronger pressing force than that in the state where pressing is not performed. In the present specification, the same meaning applies to "pressing is performed" or "pressing is not performed".

The sensor which detects vibration of the human body is not limited to the piezoelectric sensor. Various vibration sensors capable of detecting vibration can be used.

In the first control, the electronic device may be switched from a power OFF state to a power ON state. In the second control, control suitable for each electronic device may be performed. For example, in a smartphone, selection of an icon or enlargement of a screen may be performed. The first control and the second control need not be totally different controls. For example, in a flashlight, such control may be performed that weak light is lit by the first control and strong light is lit by the second control. In a smartphone, a series of similar controls, such as enlarging the screen slowly in the first control and enlarging the screen quickly in the second control, may be performed.

When the human body is in a contact state and pressing is not performed, the first control may be executed, and when the human body is in a noncontact state and electrostatic capacitance is changed, the first control may not be executed. Consequently, predetermined control is not executed in a state where the human body is in a noncontact state and the electrostatic capacitance is changed, so that it is possible to suppress unintentional execution of predetermined control. For example, in an electronic device including a capacitance sensor such as a smartphone, it is possible to suppress execution of predetermined control when an object which changes the electrostatic capacitance comes in contact in a state where there is no human body contact.

When an object in contact with the human body comes in contact with the pressing portion, the first control may be executed, and when an object not in contact with the human body comes in contact with the pressing portion, the first control may not be executed. Even when an object in contact with the human body comes in contact with the pressing portion, since vibration of the human body is transmitted via the object, predetermined control may be executed. When an object not in contact with the human body comes in contact with the pressing portion, vibration of the human body is not transmitted, so that predetermined control is not executed. With this, execution of unintentional control can be suppressed.

For example, in the case of a wearable terminal, depending on presence or absence of minute vibration, a state of attachment/non-attachment to the human body may be determined, and ON/OFF of a power supply may be switched.

In a smartphone or an electronic book, for example, the pressing sensor of the present disclosure may be disposed at an end portion of the display, and the speed of turning a page may be changed according to the pressing force. Also in this case, it is possible to prevent erroneous operation due to operations other than the human body.

In the case of smart glasses, for example, the pressing sensor of the present disclosure may be disposed at the earpiece of the eyeglasses, and volume adjustment, fast forward/rewind of the screen, and the like may be performed.

In the above-described embodiment, the piezoelectric film 221 formed of polylactic acid is used for the piezoelectric sensor 1, but it should be appreciated that this design is not a limitation. In implementation, another piezoelectric film such as PVDF, piezoelectric ceramic, or the like can be used. However, since PVDF has pyroelectricity, there is a disadvantage that charge generation due to temperature change is also accumulated, so that PLLA without pyroelectricity is more suitable.

Although a piezoelectric sensor is required in the pressing sensor including the first current-voltage conversion circuit according to the present disclosure, when presence or absence of the minute vibration state of the pressing portion is detected using a pressure sensor which generates a detection signal corresponding to the deformation amount of the pressing portion, there may be used a sensor, which can extract the deformation amount of the pressing portion as an electrical signal, other than the piezoelectric sensor. The "pressure sensor" according to the present exemplary embodiments may include an amplifier circuit in some cases.

Finally, the description of the above embodiments is to be considered in all respects as illustrative and not limiting. The person skilled in the art can perform variations and modifications as appropriate. For example, configurations illustrated in different embodiments are able to be partially replaced and combined with each other. The scope of the present disclosure is indicated by the appended claims rather than by the above embodiments, and all changes which come within the meaning and range of equivalency of the claims are intended to be embraced therein.

DESCRIPTION OF REFERENCE SYMBOLS

C10, C20: Compensation capacitance
OA1, OA2: Operational amplifier
PS: Power supply circuit
R10, R20: Feedback resistor
VS: Voltage source
1: Piezoelectric sensor
2: Analog circuit
3: AD converter
4: Arithmetic section
10: First current-voltage conversion circuit
20: Second current-voltage conversion circuit
30: Reference potential generation circuit
101: Pressing sensor
200: Controller
201: Housing 202: End portion
203: Substrate
221: Piezoelectric film
224: First electrode
225: Second electrode
226: Substrate
229: Third electrode
230: Circuit board
250: Coverlay
301: Electronic writing instrument

The invention claimed is:

1. A pressing sensor comprising:
   a piezoelectric sensor configured to generate a detection voltage corresponding to a deformation amount of a pressing surface;
   a first current-voltage conversion circuit configured to convert a charge/discharge current for a capacitance of the piezoelectric sensor into a voltage signal;
   a second current-voltage conversion circuit configured to current-voltage convert a current corresponding to a change rate of an output voltage of the first current-voltage conversion circuit;
   a deformation amount detector configured to obtain an integrated value of an output voltage from the second current-voltage conversion circuit and determine the integrated value as the deformation amount of the pressing surface;
   a minute vibration sensor configured to detect presence or absence of minute vibration of the pressing surface based on a minute fluctuation state of the output voltage; and
   an integration reset processor configured to reset the integrated value obtained by the deformation amount detector when the minute vibration sensor detects an absence of the minute vibration.

2. The pressing sensor according to claim 1, wherein the minute vibration sensor is further configured to detect the presence or absence of the minute vibration based on whether the deformation amount calculated by the deformation amount detector exceeds a predetermined threshold.

3. The pressing sensor according to claim 1, wherein the deformation amount detector comprises an AD converter configured to convert the output voltage of the first current-voltage conversion circuit into a digital value.

4. The pressing sensor according to claim 3, further comprising a processor configured to integrate the digital value obtained by the AD converter.

5. The pressing sensor according to claim 3, further comprising a processor configured to perform a second-order integration operation on the digital value from the AD converter.

6. The pressing sensor according to claim 5, wherein the processor is further configured to reset a first-order integrated value when one of a change amount and a change rate of the first-order integrated value is less than a predetermined value.

7. The pressing sensor according to claim 1, wherein the first current-voltage conversion circuit comprises an operational amplifier with an inverting input coupled to the piezoelectric sensor and a non-inverting input coupled to a reference potential generating circuit.

8. The pressing sensor according to claim 7, wherein the first current-voltage conversion circuit further comprises a resistor and a capacitor each coupled in parallel between the inverting input and an output of the operational amplifier, and wherein the voltage signal is output by the operational amplifier.

9. The pressing sensor according to claim 8, wherein the second current-voltage conversion circuit includes an operational amplifier with an inverting input configured to receive the current corresponding to the change rate of the output voltage and a non-inverting input coupled to the reference potential generating circuit.

10. The pressing sensor according to claim 9, wherein the second current-voltage conversion circuit further comprises a capacitor coupled between the inverting input of the operational amplifier and the output of the operational amplifier of the first current-voltage conversion circuit and is configured to cut a low frequency component of the voltage signal.

11. An electronic device comprising the pressing sensor according to claim 1, and further comprising a controller configured to perform a predetermined control action based on the presence or absence of the minute vibration and the detection result of the deformation amount detector.

12. A pressing sensor comprising:
    a pressing surface deformable by a pressing force;
    a pressure sensor configured to generate a detection signal corresponding to a deformation amount of the pressing surface;
    a first current-voltage conversion circuit that includes an operational amplifier with an inverting input coupled to the pressure sensor and a non-inverting input coupled to a reference potential generating circuit;
    a second current-voltage conversion circuit configured to current-voltage convert a current corresponding to a change rate of an output voltage of the first current-voltage conversion circuit, the second current-voltage conversion circuit including an operational amplifier with an inverting input configured to receive the current corresponding to the change rate of the output voltage and a non-inverting input coupled to the reference potential generating circuit;
    a deformation amount detector configured to detect the deformation amount based on an output voltage from the second current-voltage conversion circuit; and
    a minute vibration sensor configured to detect a presence or an absence of minute vibration of the pressing surface based on a presence or an absence of a minute fluctuation state of the detection signal generated by the pressure sensor.

13. The pressing sensor according to claim 12, wherein the minute vibration sensor is further configured to detect the presence or absence of the minute vibration based on whether the deformation amount calculated by the deformation amount detector exceeds a predetermined threshold.

14. The pressing sensor according to claim 12,
    wherein the first current-voltage conversion circuit further comprises a resistor and a capacitor each coupled in parallel between the inverting input and an output of the operational amplifier,
    wherein the operational amplifier outputs a voltage signal.

15. The pressing sensor according to claim 12, wherein the second current-voltage conversion circuit further comprises a capacitor coupled between the inverting input of the operational amplifier and the output of the operational amplifier of the first current-voltage conversion circuit and is configured to cut a low frequency component of the voltage signal.

16. An electronic device comprising the pressing sensor according to claim 12, and further comprising a controller configured to perform a predetermined control action based on the presence or absence of the minute vibration and the detection result of the deformation amount detector.

* * * * *